(12) United States Patent
Shinoda et al.

(10) Patent No.: US 7,742,277 B2
(45) Date of Patent: Jun. 22, 2010

(54) DIELECTRIC FILM CAPACITOR AND METHOD OF MANUFACTURING THE SAME

(75) Inventors: Tomotaka Shinoda, Tokyo (JP); Kinji Yamada, Tokyo (JP); Takahiro Kitano, Kumamoto (JP); Yoshiki Yamanishi, Sanda (JP); Muneo Harada, Nishinomiya (JP); Tatsuzo Kawaguchi, Fujisawa (JP); Yoshihiro Hirota, Kyoto (JP); Katsuya Okumura, Tokyo (JP); Shuichi Kawano, Ogaki (JP)

(73) Assignee: Ibiden Company Limited, Ogaki-shi (JP)

(*) Notice: Subject to any disclaimer, the term of this patent is extended or adjusted under 35 U.S.C. 154(b) by 222 days.

(21) Appl. No.: 11/508,204

(22) Filed: Aug. 23, 2006

(65) Prior Publication Data

US 2007/0126041 A1 Jun. 7, 2007

(30) Foreign Application Priority Data

Aug. 24, 2005 (JP) ............................. 2005-242472
Aug. 24, 2005 (JP) ............................. 2005-242473

(51) Int. Cl.
*H01G 4/06* (2006.01)
*H01G 4/005* (2006.01)

(52) U.S. Cl. ..................... 361/311; 361/303; 29/25.42

(58) Field of Classification Search ................. 361/311, 361/303, 312, 320
See application file for complete search history.

(56) References Cited

U.S. PATENT DOCUMENTS

| | | | | |
|---|---|---|---|---|
| 5,489,548 A | * | 2/1996 | Nishioka et al. | 438/396 |
| 5,889,299 A | * | 3/1999 | Abe et al. | 257/295 |
| 6,822,276 B1 | * | 11/2004 | Torii et al. | 257/295 |
| 7,196,898 B2 | * | 3/2007 | Osaka et al. | 361/321.1 |
| 7,276,412 B2 | * | 10/2007 | Kim | 438/255 |
| 2005/0111162 A1 | * | 5/2005 | Osaka et al. | 361/271 |
| 2005/0133885 A1 | * | 6/2005 | Iwashita et al. | 257/532 |
| 2006/0046377 A1 | * | 3/2006 | Koiwa et al. | 438/238 |

FOREIGN PATENT DOCUMENTS

| | | |
|---|---|---|
| JP | 8-78636 | 3/1996 |
| JP | 11-126880 | 5/1999 |
| JP | 2000-252163 | 9/2000 |
| JP | 2004-029759 | 1/2004 |
| JP | 2004-349394 | 12/2004 |
| JP | 2005-85812 | 3/2005 |
| JP | 2005-101531 | 4/2005 |

* cited by examiner

*Primary Examiner*—Eric Thomas
(74) *Attorney, Agent, or Firm*—Oblon, Spivak, McClelland, Maier & Neustadt, L.L.P.

(57) ABSTRACT

A dielectric film capacitor includes a lower electrode having an opening and formed of a material including platinum, a dielectric film provided over the lower electrode and including an oxide having an ABOx crystal structure, and an upper electrode provided over the dielectric film. The planar area of the lower electrode is 50% or more of the area of a formation region of the dielectric film. A dielectric film capacitor includes a lower electrode formed of a material including platinum and having a thickness of 10 to 100 nm, a dielectric film provided over the lower electrode and including an oxide having an ABOx crystal structure, and an upper electrode provided over the dielectric film.

18 Claims, 6 Drawing Sheets

DIELECTRIC FILM CAPACITOR AND METHOD OF MANUFACTURING THE SAME

Japanese Patent Application No. 2005-242472 filed on Aug. 24, 2005 and Japanese Patent Application No. 2005-242473 filed on Aug. 24, 2005 are hereby incorporated by reference in its entirety.

BACKGROUND OF THE INVENTION

The present invention relates to a dielectric film capacitor and a method of manufacturing the same.

An increase in speed and capacity and a reduction in size will be more and more demanded for devices (e.g. mobile communication terminals represented by portable telephones) in the information technology field. Accordingly, high-performance devices have been widely and extensively researched and developed in order to satisfy such demands. A dielectric material having an ABOx (perovskite) crystal structure represented by barium titanate, barium strontium titanate, or lead zirconate titanate has been widely used in the electronic device field as the material for a capacitor, memory, and the like.

In order to further reduce the size and increase the performance of such electronic devices, it is indispensable to reduce the thickness of each element. This requires establishment of manufacturing technology for a dielectric film capacitor exhibiting high performance and high quality.

A dielectric film capacitor generally has a structure in which a substrate, insulating layer, lower electrode, dielectric film, and upper electrode are stacked in that order. The dielectric film may be formed by sputtering, chemical vapor deposition (CVD), molecular beam epitaxy (MBE), a sol-gel method, metalorganic decomposition (MOD), or the like. In particular, a liquid phase method has attracted attention which reduces production cost, facilitates composition control, easily provides a desired shape, and does not require an expensive manufacturing device.

When forming the dielectric film using a vapor phase method, the dielectric characteristics of the dielectric film must be generally improved by subjecting the resulting dielectric film to heat treatment in an oxidizing atmosphere. When forming the dielectric film using a liquid phase method, a coating obtained by applying a sol-gel solution in which an organic compound as the raw material for the dielectric film is dissolved in an organic solvent or a solution in which dielectric material particles are dispersed must be generally subjected to heat treatment in an oxidizing atmosphere. Therefore, a noble metal which is rarely oxidized is used as the material for the lower electrode. Specifically, a material containing platinum (Pt) is widely used as the material for the lower electrode.

When forming a dielectric film capacitor on a silicon wafer, a lower electrode (e.g. Pt film) is formed on a silicon-based insulating layer (e.g. silicon oxide layer) formed on the silicon wafer, for example. However, since the adhesion between the silicon-based insulating layer and the lower electrode (Pt film) is poor, the lower electrode is easily separated from the silicon-based insulating layer. The separation of the lower electrode makes it difficult to manufacture a dielectric film capacitor using a method such as patterning or dicing/cutting. In order to solve this problem, a method has been proposed in which an adhesive layer is formed between the silicon-based insulating layer and the lower electrode in an attempt to improve the adhesion between the silicon-based insulating layer and the lower electrode.

For example, JP-A-8-78636 attempts to improve the adhesion between a silicon oxide layer and a noble metal electrode film by forming a titanium (Ti) film (adhesive layer) between the silicon oxide layer and the noble metal electrode film. On the other hand, the substrate may be warped due to oxidation of the Ti film, or an oxide resulting from oxidation of the Ti film may be diffused at the interface between the noble metal electrode film and the dielectric film.

JP-A-2004-349394 attempts to improve the adhesion between a silicon oxide layer and a platinum electrode film by forming a gold (Au) film (adhesive layer) between the silicon oxide layer and the platinum electrode film, for example. However, it is disadvantageous to form a multilayer noble metal thin film from the viewpoint of device manufacturing cost. Moreover, this method does not necessarily provide improved adhesion due to insufficient adhesion between the Au film and the silicon oxide layer.

JP-A-2005-85812 and JP-A-2005-101531 attempt to improve the adhesion between a silicon oxide layer and a platinum electrode film by forming an adhesive layer using the same material as the dielectric film between the silicon oxide layer and the platinum electrode film to reduce the stress applied to the film, for example. According to this method, since the adhesive layer and the dielectric layer are formed of the same material, the characteristics of the dielectric film capacitor do not deteriorate even if the adhesive layer is diffused at the interface between the lower electrode and the dielectric film. However, since it is necessary to select a dielectric material which can function as the adhesive layer, the material composition which may be used for the dielectric film is limited, whereby the characteristics of the dielectric film capacitor may be impaired.

SUMMARY

The invention was achieved in view of the above-described situation. An object of the invention is to provide a dielectric film capacitor which can provide an electrode structure in which the adhesion between a lower electrode and a layer provided under the lower electrode is improved and which is rarely oxidized and is thermally stable, ensures high yield, and exhibits excellent characteristics, and a method of manufacturing the same.

Another object of the invention is to provide an electronic circuit component including the above dielectric film capacitor.

According to a first aspect of the invention, there is provided a dielectric film capacitor comprising:

a lower electrode having an opening and formed of a material including platinum;

a dielectric film provided over the lower electrode and including an oxide having an ABOx crystal structure; and an upper electrode provided over the dielectric film;

wherein a planar area of the lower electrode is 50% or more of an area of a formation region of the dielectric film.

The term "plane" used herein refers to a plane perpendicular to the stacking direction of the lower electrode, the dielectric film, and the upper electrode. The term "planar area" used herein refers to the area on the plane perpendicular to the stacking direction. The term "formation region of the dielectric film" used herein refers to a region in which the dielectric film occupies the largest area on the plane (e.g. the upper surface of the dielectric film).

According to a second aspect of the invention, there is provided a dielectric film capacitor comprising:

a lower electrode formed of a material including platinum and having a thickness of 10 to 100 nm;

a dielectric film provided over the lower electrode and including an oxide having an ABOx crystal structure; and
an upper electrode provided over the dielectric film.
In the above dielectric film capacitor, the lower electrode may have a surface resistivity of 0.1 to 3.0 ohm/square.
According to a third aspect of the invention, there is provided a method of manufacturing a dielectric film capacitor, comprising:
(a) forming a lower electrode having an opening and formed of a material including platinum;
(b) forming a dielectric film including an oxide having an ABOx crystal structure directly on the lower electrode; and
(c) forming an upper electrode over the dielectric film;
wherein the step (a) includes patterning the lower electrode so that the planar area of the lower electrode is 50% or more of the area of a formation region of the dielectric film.
According to a fourth aspect of the invention, there is provided a method of manufacturing a dielectric film capacitor comprising:
(a) forming a lower electrode formed of a material including platinum and having a thickness of 10 to 100 nm;
(b) forming a dielectric film including an oxide having an ABOx crystal structure directly on the lower electrode; and
(c) forming an upper electrode over the dielectric film.
According to a fifth aspect of the invention, there is provided an electronic circuit component comprising the above dielectric film capacitor.

DETAILED DESCRIPTION OF THE EMBODIMENT

A dielectric film capacitor according to embodiments of the invention, a method of manufacturing the same, and an electronic circuit component are described below in detail.

1. First Embodiment 1.1. Dielectric Film Capacitor

Figure 1A:
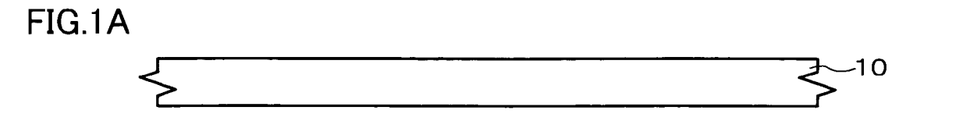
FIGS. 1A to 1F are cross-sectional views schematically showing manufacturing steps of a dielectric film capacitor 20 according to one embodiment of the invention.
Figure 1B:
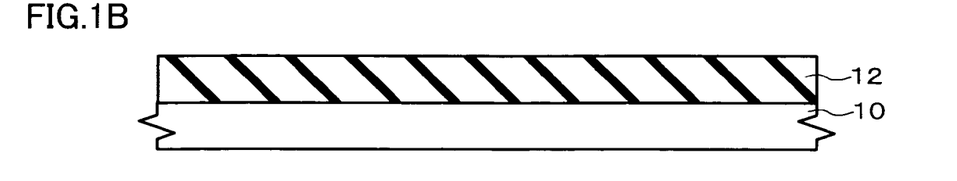
Figure 1C:
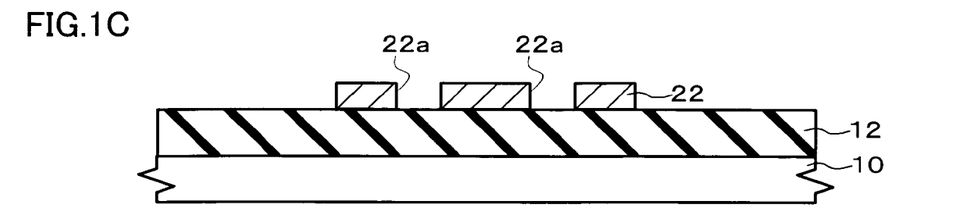
Figure 1D:
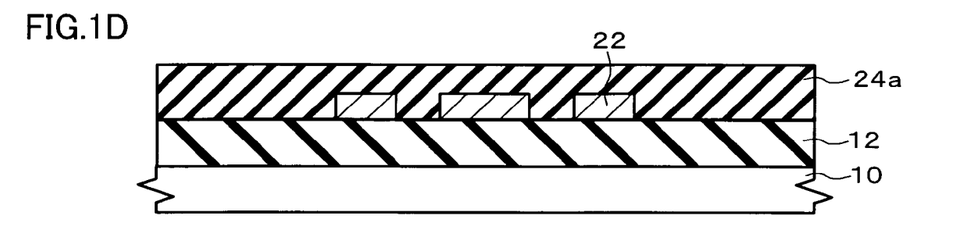
Figure 1E:
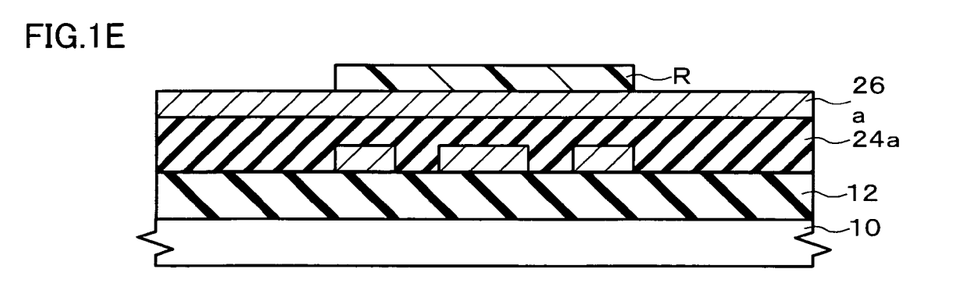
Figure 1F:
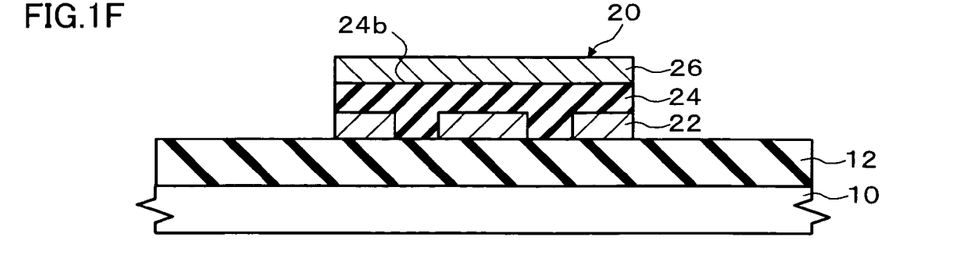
Figure 2:
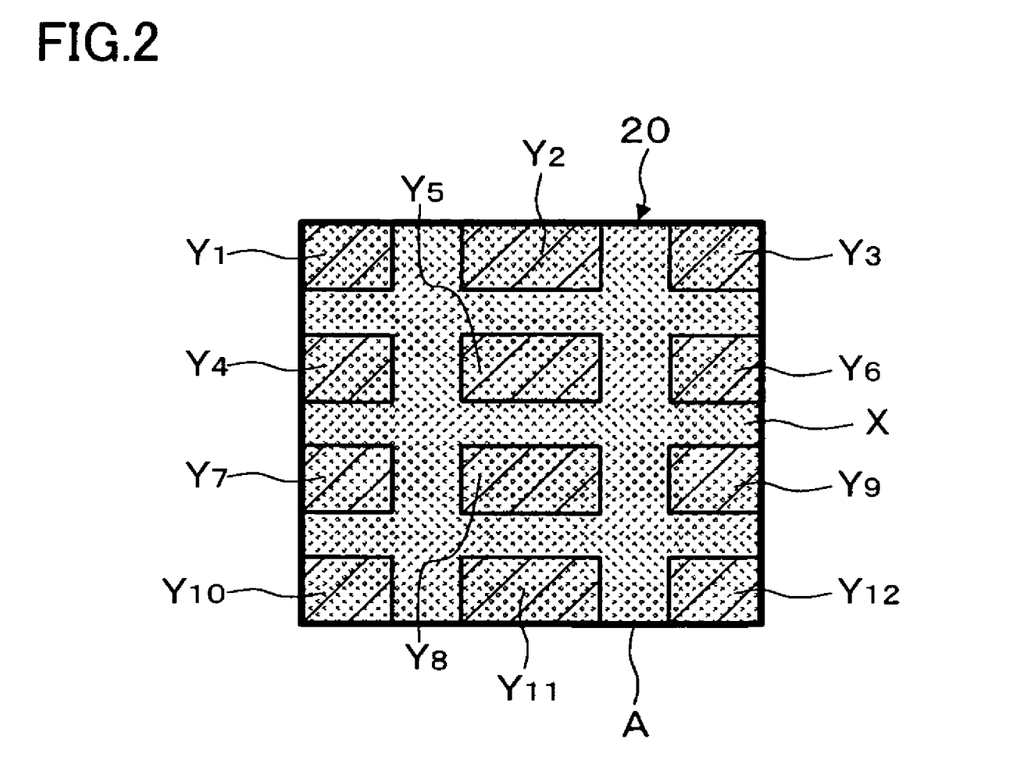
FIG. 2 is a plan view schematically showing the planar shape of a lower electrode 22 of the dielectric film capacitor 20 according to one embodiment of the invention.

FIG. 1F is a cross-sectional view schematically showing a dielectric film capacitor 20 according to one embodiment of the invention, and FIG. 2 is a plan view schematically showing a planar pattern of a lower electrode 22 of the dielectric film capacitor 20 shown in FIG. 1F.

The dielectric film capacitor 20 according to this embodiment includes the lower electrode 22, a dielectric film 24 provided over the lower electrode 22, and an upper electrode 26 provided over the dielectric film 24. As shown in FIG. 1F, the lower electrode 22 has an opening 22a. Specifically, the lower electrode 22 includes a plurality of separated portions (portions $Y_1$ to $Y_{12}$ in FIG. 2), and the space between the separated portions is the opening 22a. The dielectric film 24 includes an oxide having an ABOx crystal structure.

The dielectric film capacitor 20 according to this embodiment may be used as a thin film capacitor 20 provided in an interposer, for example.

The dielectric film capacitor 20 according to this embodiment may also be used as a ferroelectric film capacitor 20 of a ferroelectric memory device (not shown), for example. In this case, electric charges (information) are stored in the dielectric film 24 of the dielectric film capacitor 20. In this case, the ferroelectric memory device includes a transistor such as a thin film transistor (TFF) or a MOSFET (not shown) together with the dielectric film capacitor 20.

The lower electrode 22 is formed of a material including platinum. The lower electrode 22 is preferably formed of platinum or an alloy of platinum and a metal other than platinum (e.g. at least one metal selected from ruthenium, rhodium, palladium, osmium, and iridium). The lower electrode 22 may be either a single-layer film or a stacked multi-layer film.

In the oxide having an ABOx crystal structure which forms the dielectric film 24, the metal A may be one or more metals selected from Li, Na, Ca, Sr, Ba, and La, and the metal B may be one or more metals selected from Ti, Zr, Ta, and Nb. For example, the dielectric film 24 may be formed of (Pb(Zr,Ti)$O_3$) (PZT), $SrBi_2Ta_2O_9$ (SBT), or $(Bi,La)_4Ti_3O_{12}$ (BLT).

The upper electrode 26 may be formed of the material which may be used for the lower electrode 22, or may be formed of aluminum, silver, nickel, or the like. The upper electrode 26 may be either a single-layer film or a stacked multilayer film.

In this embodiment, the lower electrode 22 is provided on an insulating layer 12. The insulating layer 12 may be a silicon-based insulating layer, for example. The silicon-based insulating layer is an insulating layer including silicon. The thickness of the silicon-based insulating layer is preferably 100 to 2000 nm, and still more preferably 100 to 500 nm. If the thickness of the silicon-based insulating layer is less than 100 nm, a leakage current occurs to a large extent. If the thickness of the silicon-based insulating layer exceeds 2000 nm, the stress applied to the substrate increases.

The silicon-based insulating layer has a volume resistivity of preferably $10^{10}$ ohm-cm or more, and still more preferably $10^{12}$ ohm-cm or more. If the silicon-based insulating layer has a volume resistivity of less than $10^{10}$ ohm-cm, a leakage current occurs to a large extent.

As examples of the silicon-based insulating layer, a silicon oxide layer, silicon nitride layer, silicon oxynitride layer, silicon-based Low-k film, and the like can be given. A contact layer (not shown) may be provided under the lower electrode 22.

When the insulating layer 12 is the silicon-based insulating layer, an intermediate layer (not shown) including a metal and silicon may be formed between the silicon-based insulating layer and the lower electrode 22. The intermediate layer including a metal and silicon is formed by the reaction between the metal which forms the lower electrode 22 and a silicon atom which forms the silicon-based insulating layer. The adhesion between the lower electrode 22 and the silicon-based insulating layer can be increased by forming the intermediate layer between the silicon-based insulating layer and the lower electrode 22.

For example, when the lower electrode 22 is formed of a material including platinum, an intermediate layer including platinum and silicon is formed between the silicon-based insulating layer and the lower electrode 22. In particular, when the lower electrode 22 is formed of a material including platinum, the lower electrode 22 may be separated from the silicon-based insulating layer due to low adhesion between the lower electrode 22 and the silicon-based insulating layer. In the dielectric film capacitor 20 according to this embodiment, the adhesion between the silicon-based insulating layer (insulating layer 12) and the lower electrode 22 can be increased by disposing the silicon-based insulating layer (insulating layer 12) and the electrode (lower electrode 22) formed of a material including platinum through the intermediate layer including platinum and silicon.

In the dielectric film capacitor 20 according to this embodiment, a region X is the formation region of the dielectric film 24. The region X corresponds to an upper surface 24b of the dielectric film 24 (see FIG. 1F). The region X also corresponds to the planar pattern of the upper electrode 26.

In FIG. 2, the region X is indicated by the dots, an outer edge A of the region X is indicated by the bold line, and the portions $Y_1$ to $Y_{12}$ are indicated by the diagonal lines.

In FIG. 2, the separated portions $Y_1$ to $Y_{12}$ forming the lower electrode 22 are arranged in a lattice pattern. Note that the arrangement pattern and the size of the separated portions are not limited to those shown in FIG. 2.

In the dielectric film capacitor 20, it is preferable that the planar area of the lower electrode 22 (i.e. the total planar area of the separated portions $Y_1$ to $Y_{12}$) be 50% or more of the area of the formation region X of the dielectric film 24, as shown in FIG. 2. If the planar area of the lower electrode 22 is 50% or more of the area of the formation region X of the dielectric film 24, the adhesion between the lower electrode 22 and the layer provided under the lower electrode 22 can be increased while ensuring the electrode function of the lower electrode 22. If the planar area of the lower electrode 22 is less than 50% of the area of the formation region X of the dielectric film 24, the electrode function of the lower electrode 22 may deteriorate.

The dielectric film capacitor 20 according to this embodiment, in which the planar area of the lower electrode 22 is 50% or more of the area of the formation region X of the dielectric film 24, allows provision of an electrode structure in which the adhesion between the lower electrode 22 and the layer (insulating layer 12 in FIG. 1F) provided under the lower electrode 22 is improved and which is rarely oxidized and is thermally stable. The dielectric film capacitor 20 according to this embodiment ensures high yield and exhibits excellent characteristics. This prevents separation of the lower electrode 22 when patterning the dielectric film 24 and the upper electrode 26 formed on the lower electrode 22, for example.

In particular, when the lower electrode 22 is formed of a material including platinum and the layer provided under the lower electrode 22 is a silicon-based insulating layer, the adhesion between the lower electrode 22 and the silicon-based insulating layer can be sufficiently improved, whereby separation of the lower electrode 22 can be prevented.

1.2. Method of Manufacturing Dielectric Film Capacitor

A method of manufacturing the dielectric film capacitor 20 according to the above embodiment is described below with reference to FIGS. 1A to 1F. FIGS. 1A to 1F are cross-sectional views schematically showing manufacturing steps of the dielectric film capacitor 20 according to one embodiment of the invention.

The method of manufacturing the dielectric film capacitor 20 according to this embodiment includes (a) forming the lower electrode 22 having the opening 22a and formed of a material including platinum, (b) forming the dielectric film 24 including an oxide having an ABOx crystal structure directly on the lower electrode 22, and (c) forming the upper electrode 26 over the dielectric film 24. The step (a) includes patterning the lower electrode 22 so that the planar area of the lower electrode 22 is 50% or more of the area of the formation region X of the dielectric film 24 (see FIG. 2).

The manufacturing steps of the dielectric film capacitor 20 according to this embodiment are described below.

1.2.1. Formation of Lower Electrode 22

As shown in FIG. 1A, a substrate 10 is provided. The substrate 10 may be a semiconductor substrate such as a silicon substrate, SOI substrate, sapphire substrate, or compound semiconductor substrate.

As shown in FIG. 1B, the insulating layer 12 is formed on the substrate 10. As the material for the insulating layer 12, the material given in "1. Dielectric film capacitor" may be used. The insulating layer 12 may be formed using a known method (e.g. chemical vapor deposition (CVD), thermal oxidation, or spin coating).

As shown in FIG. 1C, the lower electrode 22 is formed on the insulating layer 12. The formation method for the lower electrode 22 is not particularly limited. For example, the lower electrode 22 may be formed by sputtering. The lower electrode 22 is formed by forming a conductive layer (not shown) for forming the lower electrode 22 and patterning the resulting conductive layer.

The lower electrode 22 may be patterned using a lift-off method or an ion milling method, for example. The lower electrode 22 having the opening 22a and including the separated portions $Y_1$ to $Y_{12}$ is thus formed.

1.2.2. Formation of Dielectric Film 24a

As shown in FIG. 1D, a dielectric film 24a is directly formed on the lower electrode 22. The dielectric film 24a is patterned in a step described later to form the dielectric film 24 with a specific pattern (see FIG. 1F). The dielectric film 24a may be formed by sputtering, CVD, molecular beam epitaxy (MBE), a sol-gel method, metalorganic decomposition (MOD), or the like. It is preferable to form the dielectric film 24a using a liquid phase method, which does not require an expensive manufacturing device, from the viewpoint of production cost and ease of controlling the composition and providing a desired shape. When forming the dielectric film 24a using the liquid phase method, the dielectric film 24a may be formed by applying a dielectric film forming composition.

In the dielectric film capacitor 20 according to this embodiment, the lower electrode 22 has the opening 22a. Therefore, when forming the dielectric film 24a by applying the dielectric film forming composition, the composition can be caused to flow into the opening 22a in the lower electrode 22, whereby the dielectric film 24a can be reliably provided in the opening 22a.

The dielectric film forming composition according to this embodiment may be a composition including at least one of (i) particles having an ABOx crystal structure and (ii) at least one compound selected from the group consisting of a metal alkoxide, metal carboxylate, metal complex, and metal hydroxide including the metal A and the metal B, and (iii) an organic solvent.

The concentration of the oxide particles (i) having an ABOx crystal structure included in the dielectric film forming composition according to this embodiment is 3 to 20 wt %, preferably 5 to 50 wt %.

Specific examples of the metal A and the metal B are the same as those given in "1. Dielectric film capacitor".

As examples of the organic solvent (iii) included in the dielectric film forming composition according to this embodiment, an alcohol solvent, polyhydric alcohol solvent, ether solvent, ketone solvent, ester solvent, and the like can be given.

The dielectric film forming composition according to this embodiment is applied to the lower electrode 22 to form a coating, and the resulting coating is dried, preferably further sintered by heating, to obtain the dielectric film 24a.

The dielectric film forming composition according to this embodiment may be applied using a known coating method such as open spin coating, closed spin coating, liquid source misted chemical vapor deposition (LSM-CVD), dipping, spraying, roll coating, printing, inkjetting, or electrophoretic coating.

The coating is dried at a temperature of usually 50 to 300° C. and preferably 100 to 250° C. A dielectric film 24a with a desired thickness can be obtained by repeatedly performing a series of operations including applying the dielectric film forming composition and arbitrary drying the coating several times. The coating is then sintered at a temperature of 300 and 900° C. and preferably 400 to 750° C. to obtain the dielectric film 24a.

1.2.3. Formation of Upper Electrode 26

As shown in FIG. 1E, a conductive layer 26a is formed on the dielectric film 24a. The conductive layer 26a is patterned in a step described later to form the upper electrode 26 with a specific pattern (see FIG. 1F). The formation method for the conductive layer 26a is not particularly limited insofar as the dielectric film 24a is not damaged to a large extent. For example, the conductive layer 26a may be formed by deposition or sputtering.

As shown in FIG. 1E, a resist layer R is formed on the conductive layer 26a by photolithography, for example. In this embodiment, the resist R has a planar shape and a size corresponding to the desired formation region X of the dielectric film 24. The dielectric film 24a and the conductive layer 26a are patterned using the resist R as a mask. The dielectric film 24 and the upper electrode 26 are thus formed.

The dielectric film 24a and the conductive layer 26a may be patterned using a known method such as wet etching or dry etching.

The dielectric film capacitor 20 according to the above embodiment may be obtained by the above steps.

2. Second Embodiment 2.1. Dielectric Film Capacitor

Figure 3A:
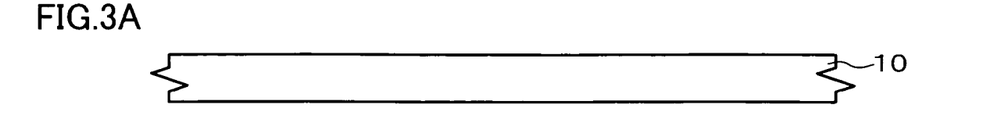
FIGS. 3A to 3F are cross-sectional views schematically showing manufacturing steps of the dielectric film capacitor 20 according to one embodiment of the invention.
Figure 3B:
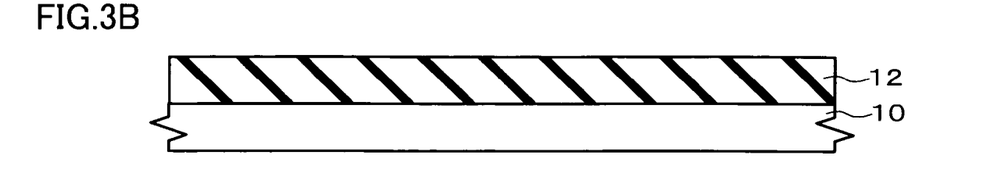
Figure 3C:
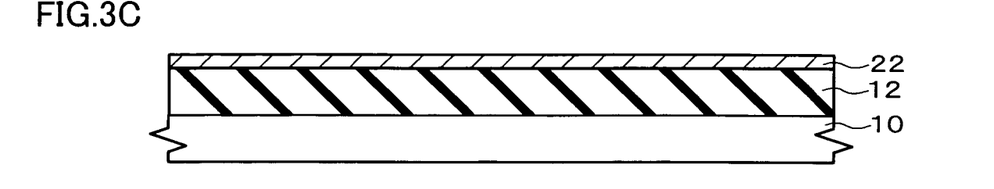
Figure 3D:
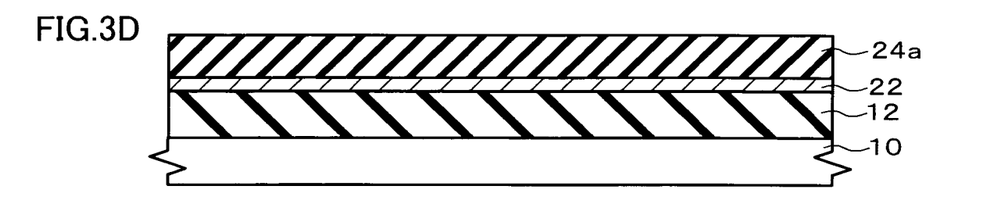
Figure 3E:
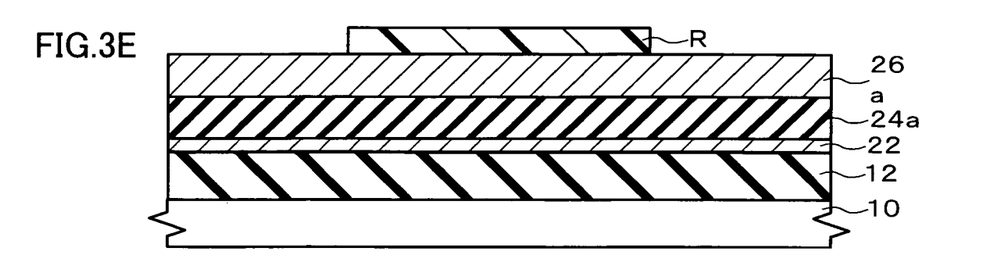
Figure 3F:
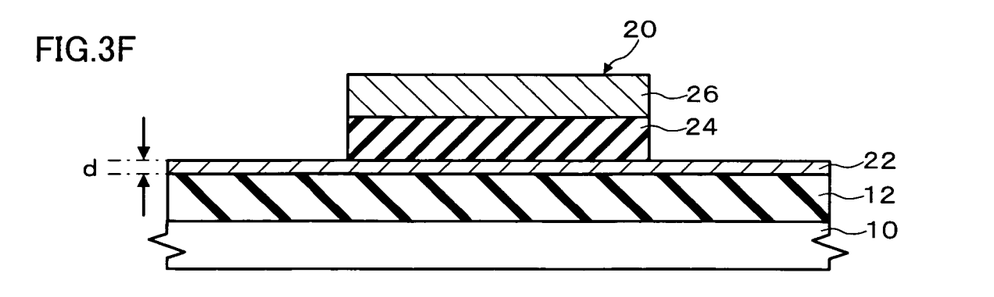

FIG. 3F is a cross-sectional view schematically showing a dielectric film capacitor 20 according to one embodiment of the invention.

The dielectric film capacitor 20 according to this embodiment includes a lower electrode 22, a dielectric film 24 provided over the lower electrode 22, and an upper electrode 26 provided over the dielectric film 24. The dielectric film 24 includes an oxide having an ABOx crystal structure.

The dielectric film capacitor 20 according to this embodiment may be used as a thin film capacitor provided in an interposer, for example.

The dielectric film capacitor 20 according to this embodiment may also be used as a ferroelectric film capacitor 20 of a ferroelectric memory device (not shown), for example. In this case, electric charges (information) are stored in the dielectric film 24 of the dielectric film capacitor 20. In this case, the ferroelectric memory device includes a transistor (not shown) such as a thin film transistor (TFF) or a MOSFET together with the dielectric film capacitor 20.

The lower electrode 22 is formed of a material including platinum. The lower electrode 22 is preferably formed of platinum or an alloy of platinum and a metal other than platinum (e.g. at least one metal selected from ruthenium, rhodium, palladium, osmium, and iridium). The thickness d (see FIG. 3F) of the lower electrode 22 is 10 to 100 nm, preferably 10 to 70 nm, and still more preferably 10 to 50 nm. If the thickness of the lower electrode 22 is less than 10 nm, the lower electrode 22 may exhibit too high an electric resistance. If the thickness of the lower electrode 22 is greater than 100 nm, the adhesion between the lower electrode 22 and a layer provided under the lower electrode 22 is decreased. Moreover, the lower electrode 22 exhibits an increased surface roughness. The lower electrode 22 may be either a single-layer film or a stacked multilayer film.

The lower electrode 22 preferably has a surface resistivity of 0.1 to 3.0 ohm/square, and still more preferably 0.1 to 1.0 ohm/square. If the surface resistivity of the lower electrode 22 exceeds 3.0 ohm/square, the resulting capacitor 20 exhibits an increased ohmic loss.

In the oxide having an ABOx crystal structure which forms the dielectric film 24, the metal A may be one or more metals selected from Li, Na, Ca, Sr, Ba, and La, and the metal B may be one or more metals selected from Ti, Zr, Ta, and Nb. For example, the dielectric film 24 may be formed of $(Pb(Zr,Ti)O_3)$ (PZT), $SrBi_2Ta_2O_9$ (SBT), or $(Bi,La)_4Ti_3O_{12}$ (BLT).

The upper electrode 26 may be formed of the material which may be used for the lower electrode 22, or may be formed of aluminum, silver, nickel, or the like. The upper electrode 26 may be either a single-layer film or a stacked multilayer film.

In this embodiment, the lower electrode 22 is provided on an insulating layer 12. The insulating layer 12 may be a silicon-based insulating layer, for example. The silicon-based insulating layer is an insulating layer including silicon. The thickness of the silicon-based insulating layer is preferably 100 to 2000 nm, and still more preferably 100 to 500 nm. if the thickness of the silicon-based insulating layer is less than 100 nm, a leakage current occurs to a large extent. If the thickness of the silicon-based insulating layer exceeds 2000 nm, the stress applied to the substrate increases.

The silicon-based insulating layer has a volume resistivity of preferably $10^{10}$ ohm-cm or more, and still more preferably $10^{12}$ ohm-cm or more. If the silicon-based insulating layer has a volume resistivity of less than $10^{10}$ ohm-cm, a leakage current occurs to a large extent.

As examples of the silicon-based insulating layer, a silicon oxide layer, silicon nitride layer, silicon oxynitride layer, silicon-based Low-k film, and the like can be given. A contact layer (not shown) may be provided under the lower electrode 22.

When the insulating layer 12 is the silicon-based insulating layer, an intermediate layer (not shown) including a metal and silicon may be formed between the silicon-based insulating layer and the lower electrode 22. The intermediate layer including a metal and silicon is formed by the reaction between the metal which forms the lower electrode 22 and a silicon atom which forms the silicon-based insulating layer. The adhesion between the lower electrode 22 and the silicon-based insulating layer can be increased by forming the intermediate layer including a metal and silicon between the silicon-based insulating layer and the lower electrode 22.

For example, when the lower electrode 22 is formed of a material including platinum, an intermediate layer including platinum and silicon is formed between the silicon-based insulating layer and the lower electrode 22. In particular, when the lower electrode 22 is formed of a material including platinum, the lower electrode 22 may be separated from the silicon-based insulating layer due to low adhesion between the lower electrode 22 and the silicon-based insulating layer. In the dielectric film capacitor 20 according to this embodiment, the adhesion between the silicon-based insulating layer (insulating layer 12) and the lower electrode 22 can be increased by disposing the silicon-based insulating layer (insulating layer 12) and the electrode (lower electrode 22) formed of a material including platinum through the intermediate layer including platinum and silicon.

The dielectric film capacitor 20 according to the invention, which includes the lower electrode formed of a material including platinum and having a thickness of 10 to 100 nm, allows provision of an electrode structure in which the adhesion between the lower electrode 22 and the layer (insulating layer 12 in FIG. 3F) provided under the lower electrode 22 is improved and the lower electrode 22 exhibits an appropriate surface roughness and which is rarely oxidized and is thermally stable. The dielectric film capacitor 20 according to the invention ensures high yield and exhibits excellent characteristics. This prevents separation of the lower electrode 22 when patterning the dielectric film 24 and the upper electrode 26 formed on the lower electrode 22, for example.

In particular, when the lower electrode 22 is formed of a material including platinum and the layer provided under the lower electrode 22 is a silicon-based insulating layer, the adhesion between the lower electrode 22 and the silicon-based insulating layer can be sufficiently improved, whereby separation of the lower electrode 22 can be prevented.

Moreover, since the lower electrode 22 exhibits an appropriate surface roughness, the amount of leakage current which flows through the dielectric thin film is reduced, and the reliability of the dielectric thin film relating to the withstand voltage is improved.

2.2. Method of Manufacturing Dielectric Film Capacitor

A method of manufacturing the dielectric film capacitor 20 according to the above embodiment is described below with reference to FIGS. 3A to 3F. FIGS. 3A to 3F are cross-sectional views schematically showing manufacturing steps of the dielectric film capacitor 20 according to one embodiment of the invention.

The method of manufacturing the dielectric film capacitor 20 according to this embodiment includes (a) forming the lower electrode 22 formed of a material including platinum and having a thickness of 10 to 100 nm, (b) forming the dielectric film 24 including an oxide having an ABOx crystal structure directly on the lower electrode 22, and (c) forming the upper electrode 26 over the dielectric film 24.

The manufacturing steps of the dielectric film capacitor 20 according to this embodiment are described below.

2.2.1. Formation of Lower Electrode 22

As shown in FIG. 3A, a substrate 10 is provided. The substrate 10 may be a semiconductor substrate such as a silicon substrate, SOI substrate, sapphire substrate, or compound semiconductor substrate.

As shown in FIG. 3B, the insulating layer 12 is formed on the substrate 10. As the material for the insulating layer 12, the material given in "1. Dielectric film capacitor" may be used. The insulating layer 12 may be formed using a known method (e.g. chemical vapor deposition (CVD), thermal oxidation, or spin coating).

As shown in FIG. 3C, the lower electrode 22 formed of a material including platinum and having a thickness of 10 to 100 nm is formed (deposited) on the insulating layer 12. The formation method for the lower electrode 22 is not particularly limited. For example, the lower electrode 22 may be formed by sputtering.

2.2.2. Formation of Dielectric Film 24a

As shown in FIG. 3D, a dielectric film 24a is directly formed on the lower electrode 22. The dielectric film 24a is patterned in a step described later to form the dielectric film 24 with a specific pattern (see FIG. 3F). The dielectric film 24a may be formed by sputtering, CVD, molecular beam epitaxy (MBE), a sol-gel method, metalorganic decomposition (MOD), or the like. It is preferable to form the dielectric film 24a using a liquid phase method, which does not require an expensive manufacturing device, from the viewpoint of production cost and ease of controlling the composition and providing a desired shape. When forming the dielectric film 24a using the liquid phase method, the dielectric film 24a may be formed by applying a dielectric film forming composition.

The dielectric film forming composition according to this embodiment may be a composition including at least one of (i) particles having an ABOx crystal structure and (ii) at least one compound selected from the group consisting of a metal alkoxide, metal carboxylate, metal complex, and metal hydroxide including the metal A and the metal B, and (iii) an organic solvent.

The concentration of the oxide particles (i) having an ABOx crystal structure included in the dielectric film forming composition according to this embodiment is 3 to 20 wt %, preferably 5 to 50 wt %.

Specific examples of the metal A and the metal B are the same as those given in "1. Dielectric film capacitor".

As examples of the organic solvent (iii) included in the dielectric film forming composition according to this embodiment, an alcohol solvent, polyhydric alcohol solvent, ether solvent, ketone solvent, ester solvent, and the like can be given.

The dielectric film forming composition according to this embodiment is applied to the lower electrode 22 to form a coating, and the resulting coating is dried, preferably further fired by heating, to obtain the dielectric film 24a.

The dielectric film forming composition according to this embodiment may be applied using a known coating method such as open spin coating, closed spin coating, liquid source misted chemical vapor deposition (LSM-CVD), dipping, spraying, roll coating, printing, inkjetting, or electrophoretic coating.

The coating is dried at a temperature of usually 50 to 300° C. and preferably 100 to 250° C. A dielectric film 24a with a desired thickness can be obtained by repeatedly performing a series of operations including applying the dielectric film forming composition and arbitrary drying the coating several times. The coating is then fired at a temperature of 300 and 900° C. and preferably 400 to 750° C. to obtain the dielectric film 24a.

2.2.3. Formation of Conductive Layer 26a and Formation of Dielectric Film 24 and Upper Electrode 26

As shown in FIG. 3E, a conductive layer 26a is formed on the dielectric film 24. The formation method for the conductive layer 26a is not particularly limited insofar as the dielectric film 24a is not damaged to a large extent. For example, the conductive layer 26a may be formed by deposition or sputtering.

As shown in FIG. 3E, a resist layer R is formed on the conductive layer 26a by photolithography, for example. In this embodiment, the resist R has a planar shape and a size corresponding to the desired planar pattern of the dielectric film 24 and the upper electrode 26. The dielectric film 24a and the conductive layer 26a are patterned using the resist R as a mask. The dielectric film 24 and the upper electrode 26 are thus formed (see FIG. 3F). As shown in FIG. 3F, the end faces of the dielectric film 24 and the upper electrode 26 coincide.

The dielectric film 24a and the conductive layer 26a may be patterned using a known method such as wet etching or dry etching.

The dielectric film capacitor 20 according to the above embodiment may be obtained by the above steps (see FIG. 3F).

3. Electronic Circuit Component

An electronic circuit component according to one embodiment of the invention includes the dielectric film capacitor 20 according to the above first or second embodiment. The electronic circuit component according to this embodiment may be used for various applications. For example, the electronic circuit component according to this embodiment may be used for electronic instruments such as mobile communication terminals (e.g. portable telephones), information processing devices, and amusement instruments.

4. Example

The invention is described below in more detail by way of examples. Note that the invention is not limited to the following examples.

4.1. Example 1

4.1.1. Preparation of Dielectric Film Forming Composition

A dielectric film forming composition used to form a dielectric film capacitor 20 of this example was prepared.

113.71 g of $Ti(OCH(CH_3)_2)_4$ was added to 609.04 g of ethylene glycol monomethyl ether. The mixture was stirred at 25° C. for 30 minutes. After the addition of 77.33 g of $Ba(OH)_2 \cdot H_2O$, the mixture was heated at 80° C. for two hours. Insoluble components were then filtered out using a Teflon (registered trademark) filter with a pore size of 0.2 micrometers.

After cooling 620.00 g of the reaction solution to 0° C., 167.40 g of water (30 times the amount (mol) of Ba) was added to the reaction solution. The mixture was then vigorously stirred to obtain a hydrolysis-condensation product. The resulting hydrolysis-condensation product was crystallized at 60° C. over three hours.

After crystallization, the resulting crystal particles were separated from the supernatant liquid by decantation. After the addition of 600 g of ethylene glycol monomethyl ether, the mixture was allowed to stand at 60° C. for three hours. The above operation was repeatedly performed four times.

After separating the crystal particles from the supernatant liquid, ethylene glycol monomethyl ether was added so that the solid content when converted to $BaTiO_3$ was 10 wt %. After the addition of a polyoxypropylene-polyoxyethylene condensate of ethylenediamine as a dispersant in an amount of 0.1 g for 100 g of the particles, the crystal particles were dispersed using an ultrasonic disperser. A dielectric film forming composition (1) according to this example containing the particles having an ABOx crystal structure (component (i)) was thus obtained.

Figure 5:
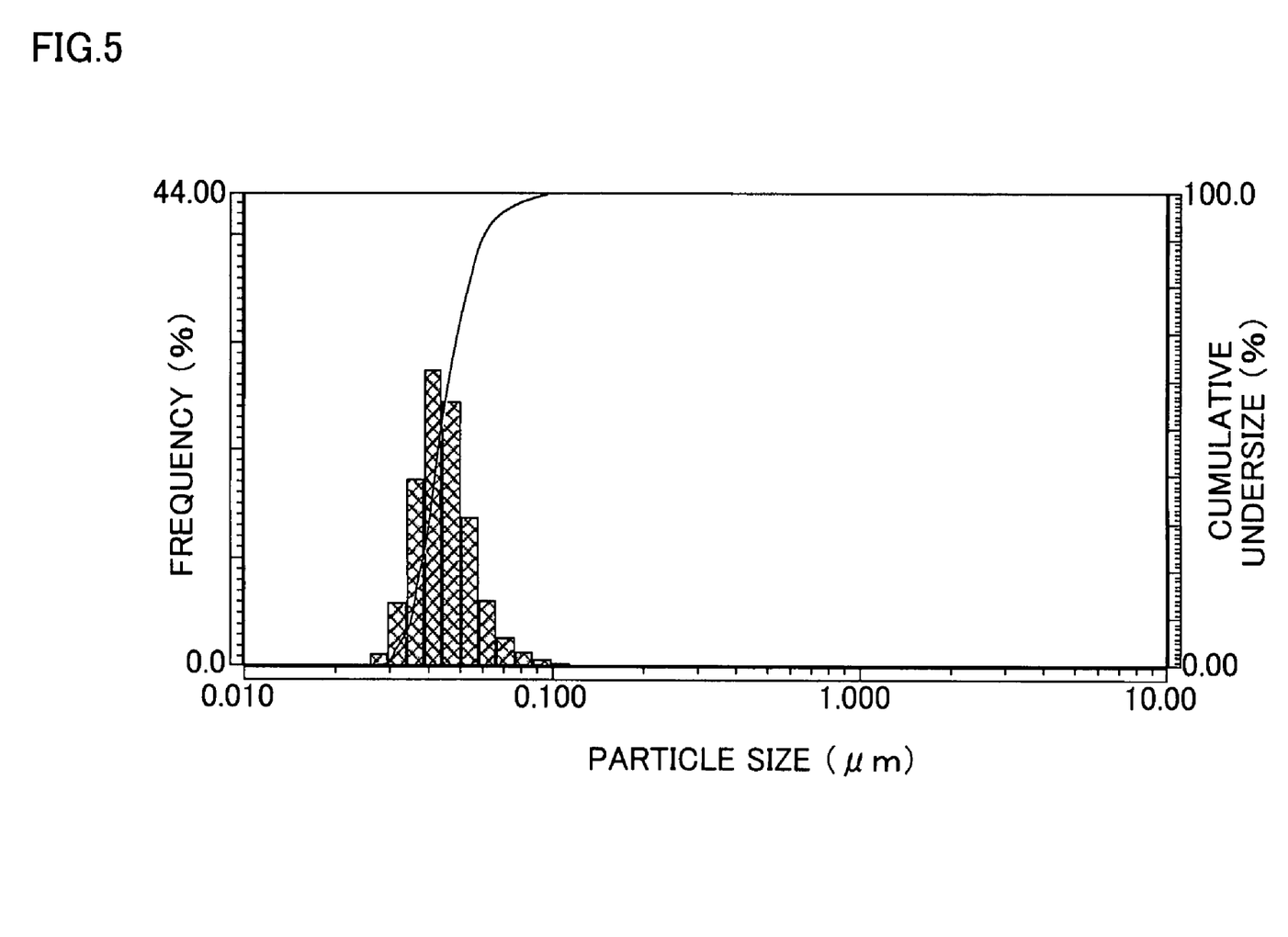
FIG. 5 is a graph showing the particle size distribution of oxide particles having an ABOx crystal structure (component (i)) in a liquid dispersion obtained in Example 1.

FIG. 5 shows the results of the particle diameter distribution of the particles having an ABOx crystal structure contained in the dielectric film forming composition (1) which was measured by a dynamic light scattering method using a dynamic light scattering nanoparticle size analyzer ("LB-500" manufactured by Horiba, Ltd.). As shown in FIG. 5, the particles contained in the liquid dispersion had a particle distribution centering around 40 nm (average particle diameter of about 40 nm). Note that large particles could be easily filtered out from the dielectric film forming composition (1) using a filter with a pore size of 200 nm.

Figure 6:
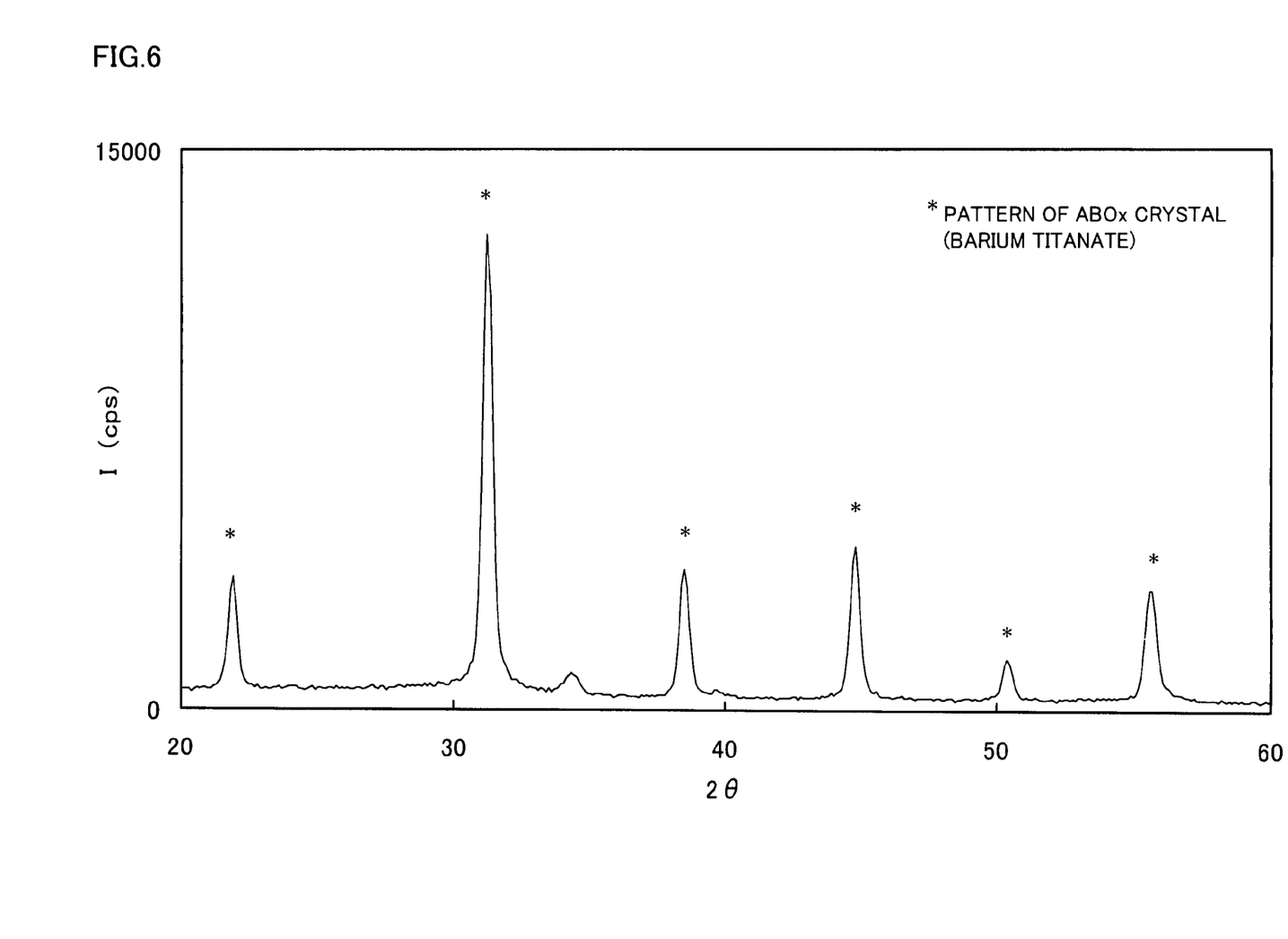
FIG. 6 is a view showing X-ray diffraction results of a dried product of a dielectric film forming composition (1) obtained in Example 1.

The crystal structure of the particles having an ABOx crystal structure (component (i)) according to this example was determined by X-ray analysis. The liquid dispersion of the particles having an ABOx crystal structure was dripped onto a glass plate, dried at room temperature, and subjected to X-ray analysis using an X-ray diffractometer ("MXP18A" manufactured by Mac Science Co., Ltd.). FIG. 6 shows the X-ray diffraction chart of the particles. As shown in FIG. 6, it was confirmed that the particles having an ABOx crystal structure contained in the dielectric film forming composition (1) had an ABOx crystal structure of a $BaTiO_3$ complex oxide.

4.1.2. Formation of Dielectric Film Capacitor 20

4.1.2a. Formation of Lower Electrode 22

As shown in FIG. 1A, the substrate 10 formed of single-crystal silicon was provided. As shown in FIG. 1B, the insulating layer (silicon oxide layer) 12 with a thickness of 0.1 micrometer was formed on the substrate 10 using a thermal oxidation method.

As shown in FIG. 1C, a resist pattern was formed on the insulating layer 12, and a Pt film with a thickness of 30 nm was deposited over the insulating layer 12 by sputtering. The resist pattern was then dissolved and removed to form the Pt lower electrode 22.

In this example, the planar area of the lower electrode 22 (i.e. the total planar area of the portions $Y_1$ to $Y_{12}$) was 50% of the area of the formation region X of the dielectric film 24 (see FIG. 2).

4.1.2b. Formation of Dielectric Film 24

As shown in FIG. 1D, the dielectric film 24a was formed on the lower electrode 22. In this example, the dielectric film 24a was formed using a liquid phase method.

The dielectric film forming composition (1) was applied to the Pt lower electrode 22 having the thickness of 30 nm and exhibiting excellent adhesion and excellent surface roughness using a spin coater at 300 rpm for five seconds and at 3000 rpm for 15 seconds to form a coating. The coating was dried at 250° C. for one minute and then sintered at 75° C. for 60 minutes. The above operation was repeatedly performed twice to form the dielectric film 24a with a thickness of 242 nm.

4.1.2c. Formation of Upper Electrode 26

As shown in FIG. 1E, the conductive layer (Ni film) 26a with a thickness of 50 nm was deposited on the dielectric film 24a by sputtering. The resist layer R was then formed on the conductive layer 26a by photolithography. The resist layer R had a planar shape and a planar area corresponding to the dielectric film 24 to be formed. The dielectric film 24a and the conductive layer 26a are wet-etched using the resist R as a mask to form the dielectric film 24 and the upper electrode 26 with a planar area of 100 mm² and a thickness of 200 nm (see FIG. 1F). The dielectric film capacitor 20 according to this example was formed by the above steps.

4.1.3. Evaluation of Electrical Characteristics of Dielectric Film Capacitor 20

The relative dielectric constant, dielectric loss, and leakage current of the dielectric film capacitor 20 obtained in this example were measured. The relative dielectric constant and the dielectric loss were measured using a precision LCR meter "HP4284A" (manufactured by Yokogawa-Hewlett-Packard Ltd.), and the leakage current was measured using an electrometer "6517A" (manufactured by Keithley Instruments Inc.). The relative dielectric constant was 183 and the dielectric loss was 0.04 at a measurement frequency of 100 kHz. The leakage current was $1.10\times10^{-7}$ (A/cm$^2$) at 0.2 MV/cm.

As is clear from the above measurement results, a dielectric film capacitor 20 exhibiting excellent electrical characteristics was obtained by forming the dielectric film 24a on the Pt lower electrode 22 by applying the dielectric film forming composition, forming the conductive layer 26a on the dielectric film 24a, and forming the dielectric film 24 and the upper electrode 26 by patterning the dielectric film 24a and the conductive layer 26a by wet etching.

4.2. Comparative Example 1

In the manufacturing step of the dielectric film capacitor 20 according to Example 1, the Pt lower electrode was formed without patterning the lower electrode. Specifically, the lower electrode according to this comparative example did not have an opening and had the same planar shape and size as the dielectric film 24 and the upper electrode 26. The dielectric film 24a was then formed on the lower electrode in the same manner as in the above example. After forming the conductive layer 26a, the dielectric film 24 and the conductive layer 26a were patterned by wet etching. As a result, the lower electrode was separated, whereby a dielectric film capacitor 20 could not be formed.

In this comparative example, since the lower electrode did not have an opening (i.e. the planar area of the lower electrode 22 was almost 100% of the area of the formation region of the dielectric film 24a), the adhesion between the lower electrode and the layer under the lower electrode was decreased, whereby the lower electrode was separated.

4.3. Example 2

4.3.1. Preparation of Dielectric Film Forming Composition

In Example 2, the dielectric film forming composition prepared in Example 1 was used.

4.3.2. Formation of Dielectric Film Capacitor 20

4.3.2a. Formation of Lower Electrode 22

As shown in FIG. 3A, the substrate 10 formed of single-crystal silicon was provided. As shown in FIG. 3B, the insulating layer (silicon oxide layer) 12 with a thickness of 0.1 micrometer was formed on the substrate 10 using a thermal oxidation method.

As shown in FIG. 3C, a resist pattern was formed on the insulating layer 12, and a Pt film with a thickness of 30 nm was deposited over the insulating layer 12 by sputtering. The resist pattern was then dissolved and removed to form the Pt lower electrode 22.

4.3.2b. Formation of Dielectric Film 24

As shown in FIG. 3D, the dielectric film 24a was formed on the lower electrode 22. In this example, the dielectric film 24a was formed using a liquid phase method.

The dielectric film forming composition (1) was applied to the Pt lower electrode 22 having a thickness of 30 nm and exhibiting excellent adhesion and excellent surface roughness using a spin coater at 300 rpm for five seconds and at 3000 rpm for 15 seconds to form a coating. The coating was dried at 250° C. for one minute and then fired at 75° C. for 60 minutes. The above operation was performed twice to form the dielectric film 24a with a thickness of 195 nm.

4.3.2c. Formation of Conductive Layer 26a and Formation of Dielectric Film 24 and Upper Electrode 26

As shown in FIG. 3E, the upper electrode (Al film) 26a with a thickness of 200 nm was deposited on the dielectric film 24a by sputtering. The resist layer R was then formed on the conductive layer 26a by photolithography. The dielectric film 24a and the conductive layer 26a are wet-etched using the resist R as a mask to form the dielectric film 24 and the upper electrode 26 with a diameter of 0.5 mm (see FIG. 3F). The dielectric film capacitor 20 according to this example was formed by the above steps.

4.3.3. Evaluation of Electrical Characteristics of Dielectric Film Capacitor 20

The relative dielectric constant, dielectric loss, and leakage current of the dielectric film capacitor 20 obtained in this example were measured. The relative dielectric constant and the dielectric loss were measured using a precision LCR meter "HP4284A" (manufactured by Yokogawa-Hewlett-Packard Ltd.), and the leakage current was measured using an electrometer "6517A" (manufactured by Keithley Instruments Inc.). The relative dielectric constant was 195 and the dielectric loss was 0.04 at a measurement frequency of 100 kHz. The leakage current was $2.70\times10^{-7}$ (A/cm$^2$) at 0.2 MV/cm.

As is clear from the above measurement results, a dielectric film capacitor 20 exhibiting excellent electrical characteristics was obtained by forming the dielectric film 24a on the Pt lower electrode 22 by applying the dielectric film forming composition, forming the conductive layer 26a on the dielectric film 24a, and forming the dielectric film 24 and the upper electrode 26 by patterning the dielectric film 24a and the conductive layer 26a by wet etching.

4.4. Comparative Example 2

Formation of a dielectric capacitor 20 of Comparative Example 2 was attempted in the same manner as in the manufacturing steps of the dielectric film capacitor 20 according to Example 2 except for changing the thickness of the lower electrode to 300 nm. However, a dielectric capacitor 20 could not completed in Comparative Example 2, since the lower electrode 22 was separated when firing the lower electrode 22 at 750° C. for 60 minutes, as shown in Table 1 and FIG. 4. It is considered that the lower electrode 22 was separated due to low adhesion between the lower electrode 22 and the layer provided under the lower electrode 22, since the lower electrode 22 of Comparative Example 2 had a thickness of 300 nm. Moreover, since the lower electrode 22 of Comparative Example 2 having a thickness of 300 nm exhibited an increased surface roughness at an annealing temperature of 600° C. 750° C. and 900° C. the lower electrode 22 of Comparative Example 2 is not suitable as the lower electrode of the dielectric capacitor 20.

4.5. Example 3

The lower electrodes 22 (platinum films) with different thicknesses were formed in the same manner as in Example 2. The lower electrodes 22 were then annealed, and whether or not the adhesion of the lower electrode 22 changed depending on the annealing temperature was investigated. The results are shown in Table 1. The adhesion of the lower electrode 22 was evaluated using a cross-cut tape peeling test.

The annealing temperature corresponds to the firing temperature when forming the dielectric film 24a on the lower electrode 22. Specifically, the effects of the firing temperature of the dielectric film 24a on the lower electrode 22 (surface roughness) were investigated in Example 3.

In Table 1, the meanings of the evaluation results "A" and "B" are as follows.

A: The lower electrode 22 was not separated.

B: The lower electrode 22 was separated.

TABLE 1

| | Electrode thickness (nm) | Adhesive layer | Adhesion (annealing temperature) | | | |
|---|---|---|---|---|---|---|
| | | | Room temperature | 600° C. | 750° C. | 900° C. |
| Test Example 1 | 70 | None | A | A | A | A |
| Test Example 2 | 50 | None | A | A | A | A |
| Test Example 3 | 30 | None | A | A | A | A |
| Comparative Example 2 | 300 | None | A | B | B | B |
| Comparative Example 3 | 200 | Ti film (100 nm) | A | A | A | B |

Figure 4:
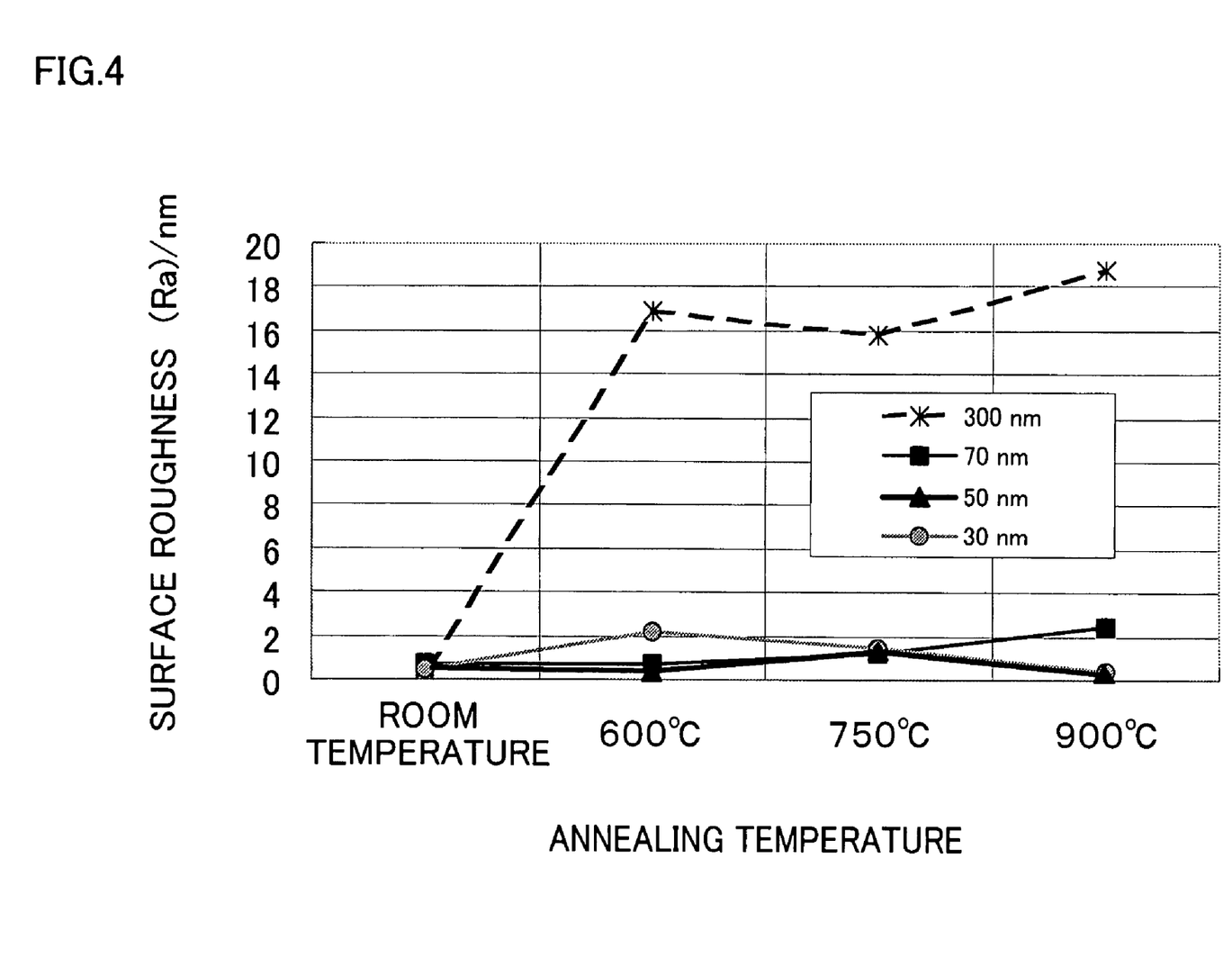
FIG. 4 is a graph showing surface roughness measurement results of a lower electrode 22 obtained in Example 2.

The surface roughness of the lower electrode 22 was investigated using an Alpha-Step IQ Surface Profiler (manufactured by KLA Tencor). The results are shown in FIG. 4. In FIG. 4, the plots for 300 nm, 70 nm, 50 nm, and 30 nm respectively correspond to Comparative Example 2 and Test Examples 1 to 3 in Table 1. In Table 1, Comparative Example 3 indicates the adhesion evaluation results when forming a Ti film (adhesive layer) with a thickness of 100 nm between the lower electrode 22 and the insulating layer 12, and forming the lower electrode 22 with a thickness of 200 nm on the adhesive layer.

As is clear from the results shown in Table 1 and FIG. 4, it was confirmed that the lower electrode 22 with a thickness of 100 nm or less (in particular 70 nm or less) is suitable as the lower electrode 22 of the dielectric capacitor 20 due to excellent adhesion and excellent surface roughness.

In Comparative Example 3 in which the adhesive layer (Ti film) was formed between the lower electrode 22 and the insulating layer 12, the lower electrode 22 was separated when the annealing temperature was 900° C. Specifically, it was found that the adhesion decreases as the annealing temperature increases when forming the adhesive layer. On the other hand, in Test Examples 1 to 3 in which an adhesive layer was not formed between the lower electrode 22 and the insulating layer 12 and the lower electrode 22 had a thickness of 10 to 100 nm, the adhesion between the lower electrode 22 and the insulating layer 12 could be maintained even when the annealing temperature is high.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A dielectric film capacitor comprising:
   a lower electrode comprising one of platinum and an alloy comprising platinum, the lower electrode having a thickness of 10 to 50 nm;
   a dielectric film provided over the lower electrode and including an oxide having an ABOx crystal structure; and
   an upper electrode provided over the dielectric film,
   wherein the lower electrode has an opening and a planar area, and the planar area of the lower electrode is 50% or more of an area of a formation region of the dielectric film.

2. The dielectric film capacitor according to claim 1, wherein the lower electrode has a surface resistivity of 0.1 to 3.0 ohm/square.

3. The dielectric film capacitor according to claim 1, wherein a metal A of the oxide having an ABOx crystal structure is at least one metal selected from the group consisting of Li, Na, Ca, Sr, Ba, and La, and a metal B of the oxide having an ABOx crystal structure is at least one metal selected from the group consisting of Ti, Zr, Ta, and Nb.

4. The dielectric film capacitor according to claim 1, wherein the lower electrode is provided on a silicon-based insulating layer.

5. The dielectric film capacitor according to claim 4, wherein the silicon-based insulating layer has a thickness of 100 to 2000 nm.

6. The dielectric film capacitor according to claim 4, wherein the silicon-based insulating layer has a volume resistivity of $10^{10}$ ohm-cm or more.

7. The dielectric film capacitor according to claim 4, wherein an intermediate layer including a metal and silicon is formed between the silicon-based insulating layer and the lower electrode.

8. The dielectric film capacitor according to claim 4, wherein the silicon-based insulating layer is a silicon oxide layer.

9. The dielectric film capacitor according to claim 4, wherein an intermediate layer comprising platinum and silicon is formed between the silicon-based insulating layer and the lower electrode.

10. An electronic circuit component comprising the dielectric film capacitor according to claim 1.

11. The dielectric film capacitor according to claim 1, wherein an intermediate layer comprising platinum and silicon is formed between the insulating layer and the lower electrode.

12. The dielectric film capacitor according to claim 1, wherein the lower electrode is formed directly on the insulating layer.

13. A method of manufacturing a dielectric film capacitor, the method comprising:
   providing an insulating layer;
   forming over the insulating layer a lower electrode comprising one of platinum and an alloy comprising platinum such that the lower electrode has a thickness of 10 to 50 nm and an opening and a planar area 50% or more of an area of a formation region of a dielectric film;
   forming the dielectric film including an oxide having an ABOx crystal structure directly on the lower electrode; and
   forming an upper electrode over the dielectric film.

14. The method according to claim 13, wherein the forming of the dielectric film includes applying a dielectric film forming composition to form the dielectric film.

15. The method according to claim 14, wherein:
the dielectric film forming composition includes at least one of (i) particles having an ABOx crystal structure and (ii) at least one compound selected from the group consisting of a metal alkoxide, metal carboxylate, metal complex, and metal hydroxide including a metal A and a metal B, and (iii) an organic solvent;
the metal A is at least one metal selected from the group consisting of Li, Na, Ca, Sr, Ba, and La; and
the metal B is at least one metal selected from the group consisting of Ti, Zr, Ta, and Nb.

16. The method according to claim 13, further comprising forming an intermediate layer comprising platinum and silicon between the insulating layer and the lower electrode.

17. The method according to claim 13, further comprising forming an intermediate layer comprising platinum and silicon between the insulating layer and the lower electrode, wherein the insulating layer is a silicon-based insulating layer.

18. The method according to claim 13, wherein the forming of the lower electrode comprises forming the lower electrode directly on the insulating layer.

* * * * *